(12) United States Patent
Buot et al.

(10) Patent No.: US 11,342,254 B2
(45) Date of Patent: May 24, 2022

(54) MULTI-DIELECTRIC STRUCTURE IN TWO-LAYER EMBEDDED TRACE SUBSTRATE

(71) Applicant: QUALCOMM Incorporated, San Diego, CA (US)

(72) Inventors: Joan Rey Villarba Buot, Escondido, CA (US); Kuiwon Kang, San Diego, CA (US); Joonsuk Park, San Diego, CA (US); Karthikeyan Dhandapani, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/819,732

(22) Filed: Mar. 16, 2020

(65) Prior Publication Data

US 2021/0287976 A1 Sep. 16, 2021

(51) Int. Cl.
*H05K 1/03* (2006.01)
*H05K 1/11* (2006.01)
*H01L 23/498* (2006.01)
*H01L 21/48* (2006.01)

(52) U.S. Cl.
CPC ...... *H01L 23/49822* (2013.01); *H01L 21/486* (2013.01); *H01L 21/4857* (2013.01); *H01L 23/49827* (2013.01); *H01L 23/49838* (2013.01); *H01L 23/49894* (2013.01); *H05K 1/0306* (2013.01); *H05K 1/11* (2013.01); *H05K 1/112* (2013.01); *H05K 1/036* (2013.01)

(58) Field of Classification Search
CPC .......... H01L 23/49822; H01L 21/4857; H01L 23/49827; H01L 23/49838; H01L 23/49894; H01L 21/486
See application file for complete search history.

(56) References Cited

U.S. PATENT DOCUMENTS

| | | | | |
|---|---|---|---|---|
| 5,670,250 | A | * 9/1997 | Sanville, Jr. .......... | B29C 70/025 174/256 |
| 8,723,050 | B2 | * 5/2014 | Cheng .................. | H05K 3/4617 174/262 |
| 2006/0191715 | A1 | * 8/2006 | Koyama .................. | H05K 3/20 174/264 |
| 2010/0215927 | A1 | * 8/2010 | Tseng ..................... | H05K 3/045 428/210 |
| 2010/0288541 | A1 | * 11/2010 | Appelt ............... | H01L 23/49827 174/257 |
| 2011/0100543 | A1 | * 5/2011 | Tseng ..................... | H05K 3/465 156/247 |

(Continued)

*Primary Examiner* — Ishwarbhai B Patel
(74) *Attorney, Agent, or Firm* — Patterson & Sheridan, L.L.P.

(57) ABSTRACT

Certain aspects of the present disclosure generally relate to an embedded trace substrate having at least two different dielectric layers with different dielectric materials and methods for fabricating the same. One example embedded trace substrate generally includes a first metal layer; a first dielectric layer disposed below the first metal layer and comprising a first dielectric material; a second dielectric layer disposed below the first dielectric layer and comprising a second dielectric material, wherein the second dielectric material of the second dielectric layer is stiffer than the first dielectric material of the first dielectric layer; and a second metal layer disposed below the second dielectric layer.

17 Claims, 5 Drawing Sheets

(56) References Cited

U.S. PATENT DOCUMENTS

| | | | | |
|---|---|---|---|---|
| 2011/0159282 A1* | 6/2011 | Kim | ............... | H05K 3/4682 |
| | | | | 428/344 |
| 2014/0034359 A1* | 2/2014 | Lee | ............... | H05K 3/465 |
| | | | | 174/251 |
| 2015/0223342 A1* | 8/2015 | Kwon | ............... | H05K 1/0268 |
| | | | | 361/761 |
| 2016/0044786 A1* | 2/2016 | Swaminathan | ............... | H01L 24/13 |
| | | | | 174/257 |
| 2016/0064319 A1* | 3/2016 | Suzuki | ............... | H01L 21/565 |
| | | | | 174/251 |
| 2016/0143149 A1* | 5/2016 | Su | ............... | H05K 1/188 |
| | | | | 174/251 |
| 2018/0138114 A1* | 5/2018 | Lee | ............... | H01L 23/3192 |
| 2018/0206345 A1* | 7/2018 | Yoneda | ............... | B32B 5/26 |
| 2019/0067211 A1* | 2/2019 | Lee | ............... | H05K 1/0284 |

\* cited by examiner

MULTI-DIELECTRIC STRUCTURE IN TWO-LAYER EMBEDDED TRACE SUBSTRATE

BACKGROUND

Field of the Disclosure

Certain aspects of the present disclosure generally relate to electronic components and, more particularly, to a two-layer embedded trace substrate (ETS) with a multi-dielectric structure.

Description of Related Art

A continued emphasis in semiconductor technology is to create improved performance electronic devices at competitive prices. This emphasis over the years has resulted in extreme miniaturization of electronic devices, made possible by continued advances in semiconductor processes and materials in combination with new and sophisticated device designs. Large numbers of transistors are employed in integrated circuits (ICs) in many electronic devices. For example, components such as central processing units (CPUs), graphics processing units (GPUs), and memory systems each employ a large quantity of transistors for logic circuits and memory devices. To form a packaged assembly, one or more IC dies may be coupled to a rigid substrate or to a flexible substrate, such as an embedded trace substrate.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description" one will understand how the features of this disclosure provide advantages that include reduction in overall volume of embedded trace substrates and via dimpling, as well as reduced warpage and cost of production.

Certain aspects of the present disclosure provide an embedded trace substrate. The embedded trace substrate generally includes a first metal layer; a first dielectric layer disposed below the first metal layer and comprising a first dielectric material; a second dielectric layer disposed below the first dielectric layer and comprising a second dielectric material, wherein the second dielectric material of the second dielectric layer is stiffer than the first dielectric material of the first dielectric layer; and a second metal layer disposed below the second dielectric layer.

Other aspects of the present disclosure generally relate to a method for fabricating an embedded trace substrate. The method generally includes forming a first metal layer; forming a first dielectric layer comprising a first dielectric material below the first metal layer; forming a second dielectric layer comprising a second dielectric material below the first dielectric layer, wherein the second dielectric material of the second dielectric layer is stiffer than the first dielectric material of the first dielectric layer; and forming a second metal layer below the second dielectric layer.

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

BRIEF DESCRIPTION OF THE DRAWINGS

So that the manner in which the above-recited features of the present disclosure can be understood in detail, a more particular description, briefly summarized above, may be by reference to aspects, some of which are illustrated in the appended drawings. It is to be noted, however, that the appended drawings illustrate only certain aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Certain aspects of the present disclosure generally relate to a two-layer embedded trace substrate (ETS) having a multi-dielectric structure and methods for fabricating the same.

Figure 1:
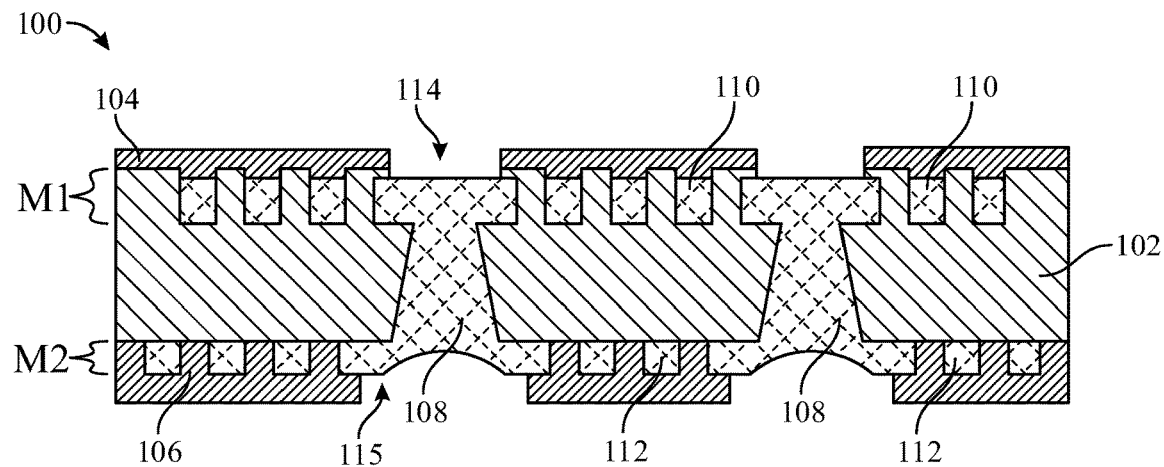
FIG. 1 is a cross-sectional view of an example embedded trace substrate.

FIG. 1 is a cross-sectional view of an example two-layer embedded trace substrate (ETS) 100. The embedded trace substrate 100 may include a dielectric layer 102, vias 108, a first metal (M1) layer, a second metal (M2) layer, upper traces 110 in the M1 layer, lower traces 112 in the M2 layer, upper solder resist (SR) 104, and lower SR 106.

The dielectric layer 102 may comprise any of various suitable dielectric materials, such as a pre-impregnated (prepreg) material. The dielectric layer 102 may have a thickness of 80 μm, for example. The M1 layer may be disposed above an upper part of the dielectric layer 102, and the M2 layer may be disposed below a lower part of the dielectric layer 102, as shown. The M1 layer and M2 layer may have different widths, where the M1 layer is thicker than the M2 layer. As an example, the M1 layer may have a height less than 16 μm (e.g., approximately 14 μm), whereas the M2 layer may have a height less than 14 μm (e.g., about 12 μm). The M1 layer may have a plurality of traces 110 routed therein; likewise, the M2 layer may have a plurality of traces 112 routed therein. The upper and lower traces 110, 112 may comprise copper (Cu), gold (Au), silver (Ag), aluminum (Al), or any other suitable conductive material. The upper SR 104 may cover the upper traces 110, whereas the lower SR 106 may cover the lower traces 112.

Furthermore, the embedded trace substrate 100 may have one or more vias 108 extending between the M1 layer and the M2 layer through the dielectric layer 102. The upper SR 104 may have gaps 114 therein to expose the vias 108 on the upper surface of the embedded trace substrate 100. Additionally or alternatively, the lower SR 106 may have gaps 115 therein to expose the vias 108 on the lower surface of the embedded trace substrate 100. The vias 108 may comprise copper, gold, silver, aluminum, or any other suitable conductive material. In certain aspects, the vias 108 may have a size of about 80 µm.

Currently, two-layer ETS seems to be reaching patterning technology limits of 8/10 line width/space (L/S) on the first metal (M1) layer of current semiconductor structures due, in part, to the fact that the maximum thickness of copper (Cu) that can be achieved may be around 16 µm. In the second metal (M2) layer, the maximum thickness may also be limited, where the limit for the M2 layer may be around 14 µm. Such limits may be implemented to control strip warpage (e.g., within 3 mm). Generally, designs that specify less than 8/10 L/S (e.g., 6/8 L/S) may constrain the M2 layer thickness to be less than 14 µm (e.g., 12 µm).

For M2 copper with a thickness of 12 µm, via dimpling may occur—as illustrated in the M2 surface of the vias 108 in FIG. 1—after copper plating on the M2 layer. Such via dimpling may inhibit proper coupling of external electronic devices to the exposed portion of the vias (e.g., due to cold solder joints) and may thus create a board-level reliability concern with a via-in-ball design, for example. To reduce via dimpling, the dielectric thickness could be reduced for better via copper fill during the copper plating process. That is, with a reduced dielectric thickness, the copper plating process may form vias with a flatter surface, which may lead to more reliable electrical connection. Conventional solutions to via dimpling, such as a thinner prepreg (60 µm PPG thickness) or alternate via designs, have not proved sufficient. For example, warpage with thinner prepreg designs is generally excessive for a suitable ETS.

Accordingly, certain aspects of the present disclosure utilize two or more dielectric layers with different materials (e.g., with different stiffness) in an embedded trace substrate. This may permit the use of smaller via sizes and accomplish the goal of eliminating, or at least reducing, via dimpling with no or acceptable warpage of the ETS. Furthermore, by reducing the thickness of dielectric material using a combination of thinner rigid core type material and prepreg material, two-layer ETS design rules can be extended to 6/8 L/S. A thinner core type material may provide a stiffer substrate than a comparable thickness of prepreg, thereby reducing warpage and permitting a smaller via size.

In certain aspects, the prepreg material may be implemented for embedding traces in the M1 layer. Such a combination of a prepreg and a thin core may reduce a via drill depth through the substrate from 80 µm to 50-60 µm. The decreased drill depth may translate to a smaller via size (e.g., ≤70 µm), which may reduce the dimpling of the vias from the plating process.

Figure 2:
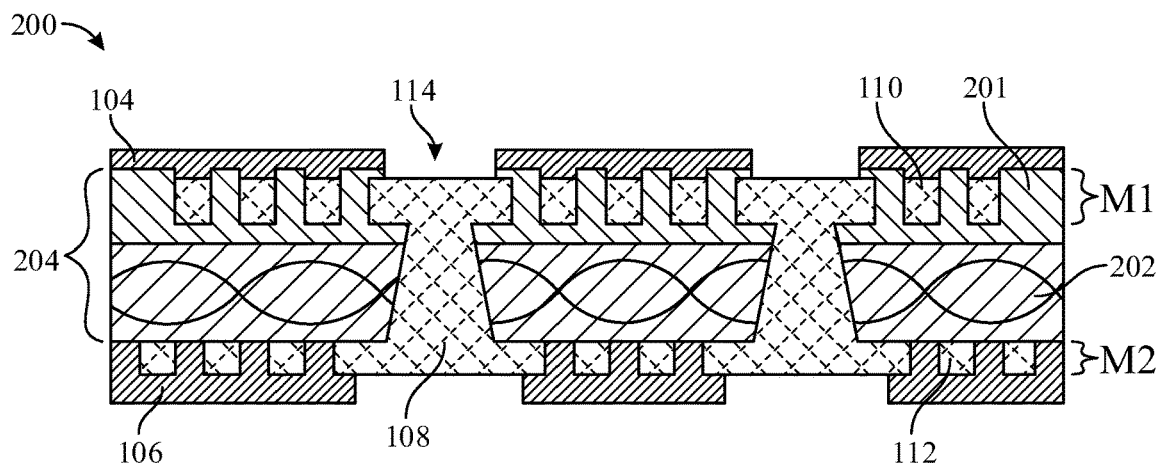
FIG. 2 is a cross-sectional view of an example embedded trace substrate having a multi-dielectric structure, according to certain aspects of the present disclosure.

FIG. 2 is a cross-sectional view of an example embedded trace substrate 200, according to certain aspects of the present disclosure. In certain aspects, the embedded trace substrate 200 may be generally similar in construction to the embedded trace substrate 100 of FIG. 1. However, the embedded trace substrate 200 may have a first dielectric layer 201 and a second dielectric layer 202 disposed below the first dielectric layer 201, where the first and second dielectric layers comprise different dielectric materials. The M1 layer is disposed above the first dielectric layer 201, and the M2 layer disposed below the second dielectric layer 202, as shown. The one or more vias 108 embedded in the embedded trace substrate 200 may extend between the M1 and M2 layers and through both the first and second dielectric layers 201, 202.

The first dielectric layer 201 may be similar to the dielectric layer 102 in the embedded trace substrate 100 of FIG. 1, but may have a reduced thickness compared thereto. For example, the first dielectric layer 201 may have a thickness of 5-25 µm (e.g., 10-15 µm). The first dielectric layer 201 may comprise any of various suitable dielectric materials, such as resin-coated copper (RCC), Ajinomoto build-up film (ABF), pre-impregnated (prepreg) material, or solder resist (SR).

In certain aspects, the second dielectric layer 202 may be a thin core type material and may be stiffer than the first dielectric layer 201. As such, the second dielectric layer 202 may be thinner than the first dielectric layer 201. For example, the second dielectric layer 202 may have a thickness of 30-60 µm (e.g., 40 µm). The second dielectric layer 202 may comprise a glass-woven material, a fiberglass material, or both. In certain aspects, the stiffer nature of the second dielectric layer 202 may provide advantages for reduced warpage and reduced via dimpling when compared to the construction of the embedded trace substrate 100 of FIG. 1.

The total thickness of the first dielectric layer 201 and the second dielectric layer 202 may be less than or equal to 70 µm (e.g., 50-60 µm). In certain aspects, the combined thickness of the first dielectric layer 201 and the second dielectric layer 202 may be no greater than 55 µm. The L/S supported by the embedded trace substrate 200 may be as small as 6/8 µm, while the L/S supported by the embedded trace substrate 100 may be no lower than 8/10 µm.

Figure 3:
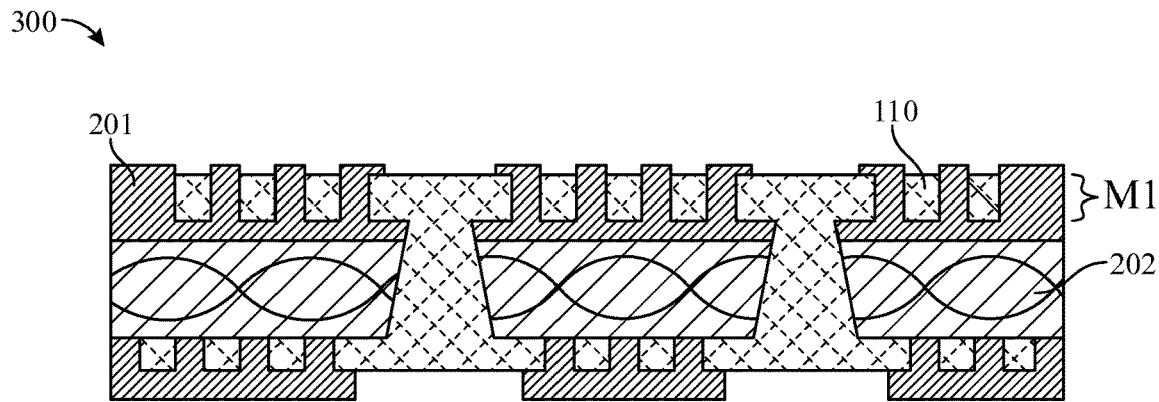
FIG. 3 is a cross-sectional view of an example embedded trace substrate having two different dielectric materials, one of these being solder resist, according to certain aspects of the present disclosure.

FIG. 3 is a cross-sectional view of an example embedded trace substrate 300 having a multi-dielectric structure, according to certain aspects of the present disclosure. The embedded trace substrate 300 may be of similar construction as the embedded trace substrate 200 of FIG. 2. However, in this particular example, the first dielectric layer 201 comprises solder resist. In this case, the solder resist may be thermally set. The upper SR 104 may be added after the solder resist of the first dielectric layer 201 is thermally set.

FIGS. 4A-4H are cross-sectional views illustrating exemplary processes for fabricating an embedded trace substrate 400 with different dielectric materials, according to certain aspects of the present disclosure. Regarding FIG. 4A, a sacrificial core 406 may be formed. An adhesive layer 404 may be added above and below the sacrificial core 406. Above and below the adhesive layers 404, conductive layers 402 may be formed. In certain aspects, the conductive layers 402 may comprise copper. The workpiece at this stage may be referred to as a "detach core."

Figure 4A:
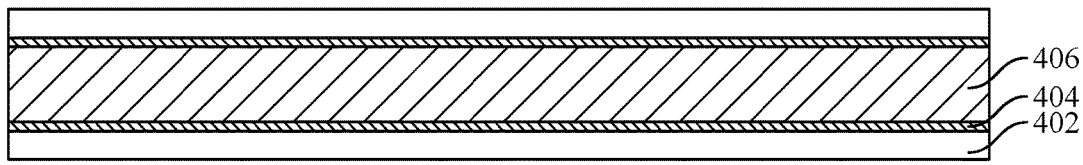
FIGS. 4A-4H are cross-sectional views illustrating exemplary fabrication processes of an embedded trace substrate with different dielectric materials, according to certain aspects of the present disclosure.
Figure 4B:
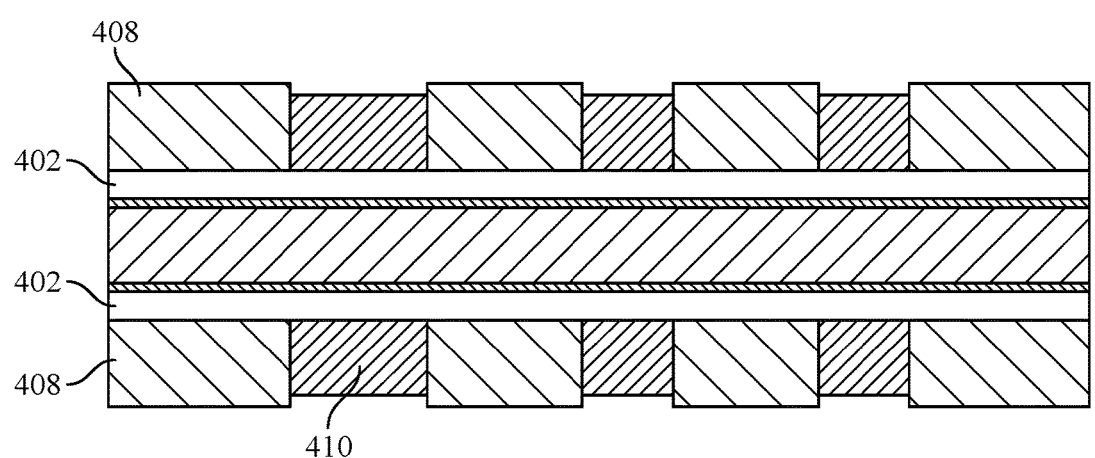

As shown in FIG. 4B, fabricating the embedded trace substrate 400 may further include forming laminate regions 408 on the top and bottom of the detach core. In certain aspects, the laminate regions 408 may comprise dry fill lamination. Additionally, conductive plating 410 may be disposed on the top and bottom of the workpiece, as shown. The conductive plating 410 may have a pattern that becomes the upper traces 110 of the M1 layer. The conductive plating 410 may undergo chemical-mechanical planarization (CMP) after initial formation. The conductive plating 410 may comprise copper, aluminum, or any other suitable conductive material. Furthermore, the conductive plating 410 may be electrically coupled to the conductive layers 402, as shown.

Figure 4C:
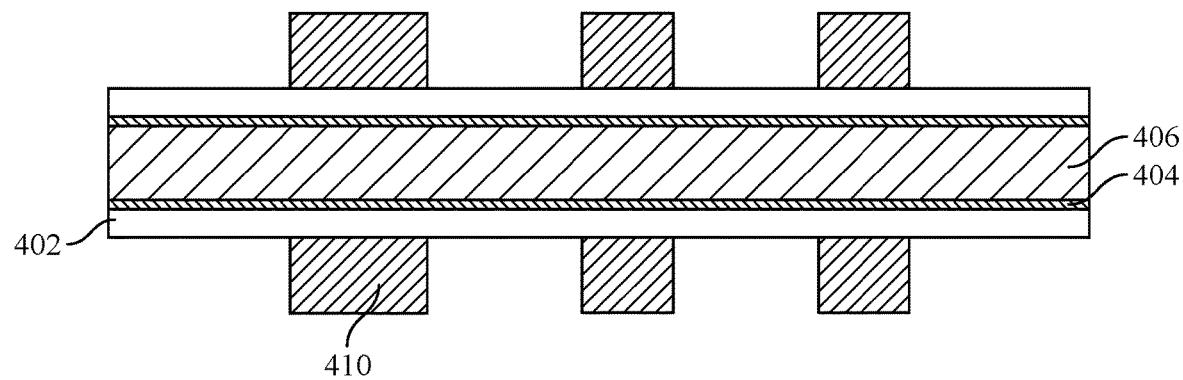

As shown in FIG. 4C, fabricating the embedded trace substrate 400 may further include stripping the laminate regions 408 from the top and bottom of the workpiece. The stripping of the laminate regions 408 may be performed through selective etching, for example.

Figure 4D:
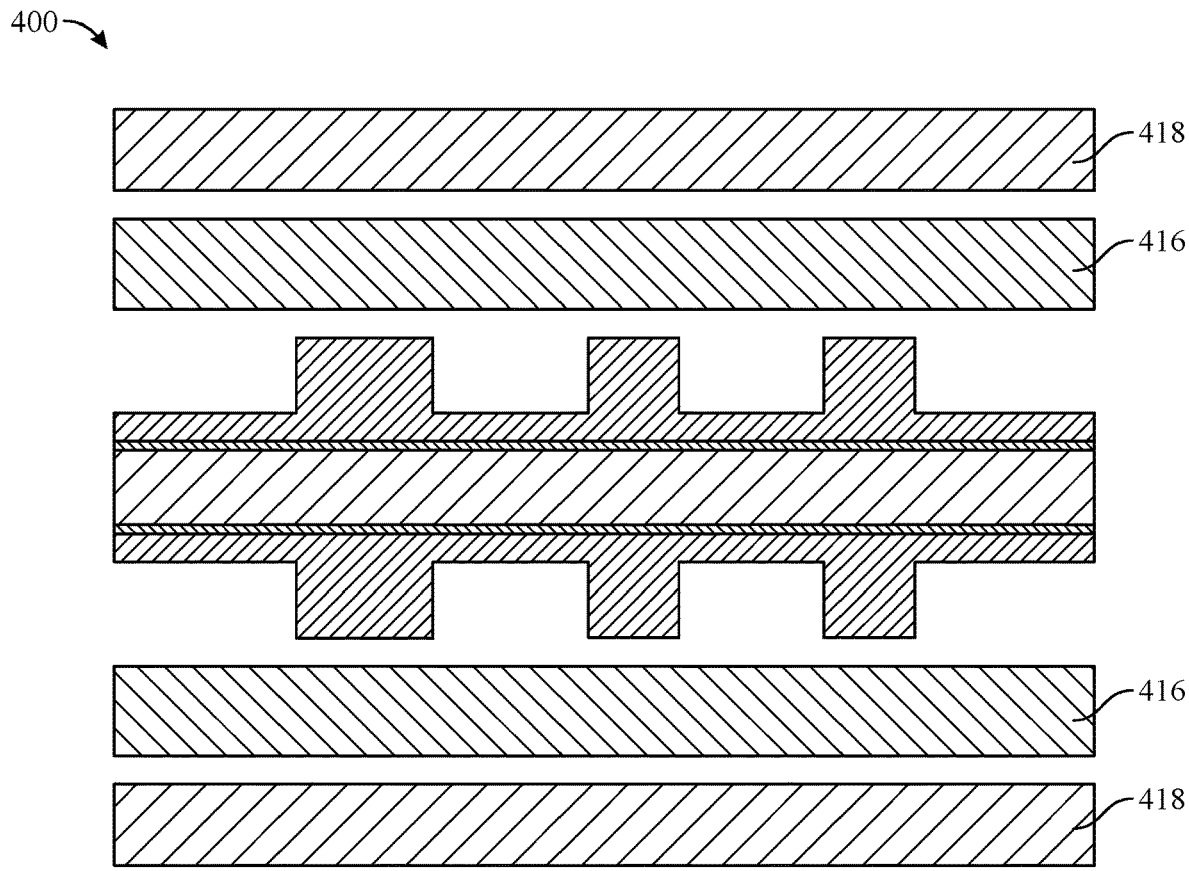

As shown in FIG. 4D, fabricating the embedded trace substrate 400 may further include applying a first dielectric layer 416 on the top and bottom of the workpiece, as well as applying a second dielectric layer 418 thereafter in a subsequent process. The first dielectric layer 416 may comprise any of various suitable dielectric materials (e.g., prepreg, ABF, RCC, or SR). In certain aspects, the second dielectric layer 418 may comprise fiberglass material, glass-woven material, or any other suitable material. During the fabrication process depicted in FIG. 4D, for certain aspects, the first dielectric layer 416 may be uncured, partially cured, or fully cured, whereas the second dielectric layer 418 may be fully cured. The first dielectric layer 416 may be allowed to at least partially cure before the second dielectric layer 418 is added to the workpiece.

Figure 4E:
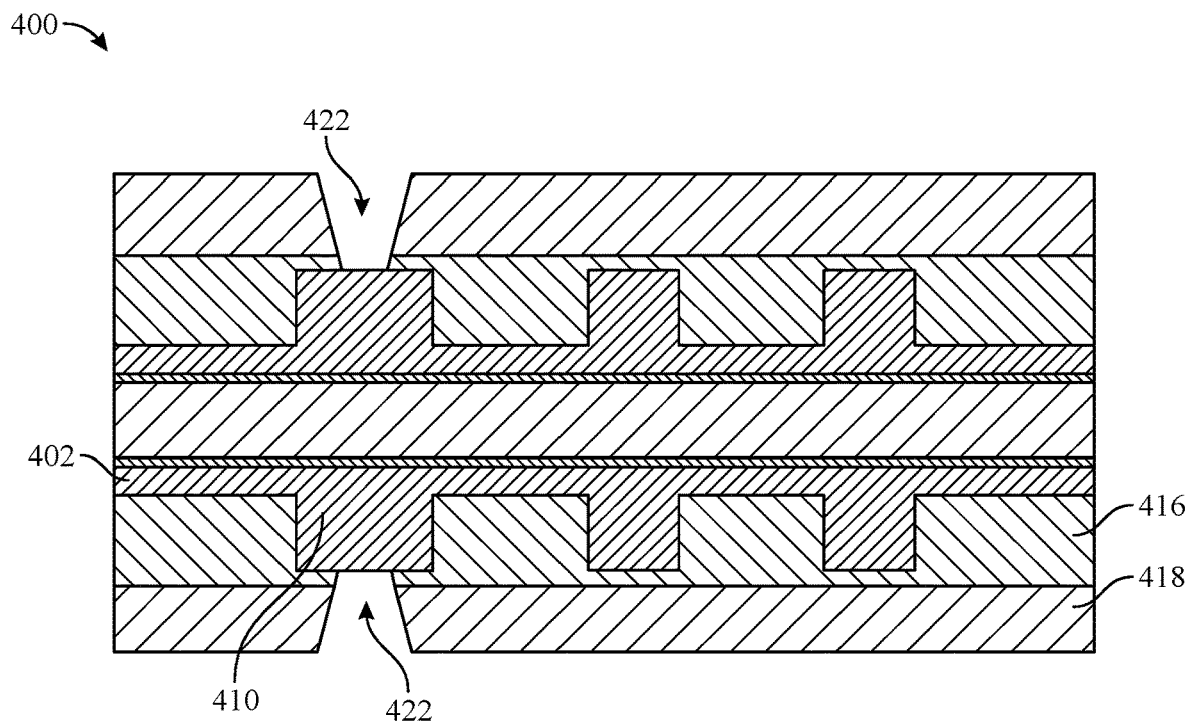

As shown in FIG. 4E, fabricating the embedded trace substrate 400 may further include forming one or more holes 422 in the first and second dielectric layers 416, 418—according to a pattern for the one or more vias 108—to expose one or more areas of the conductive plating 410 on the top and/or bottom of the workpiece. Formation of these holes 422 may include drilling, for example.

Figure 4F:
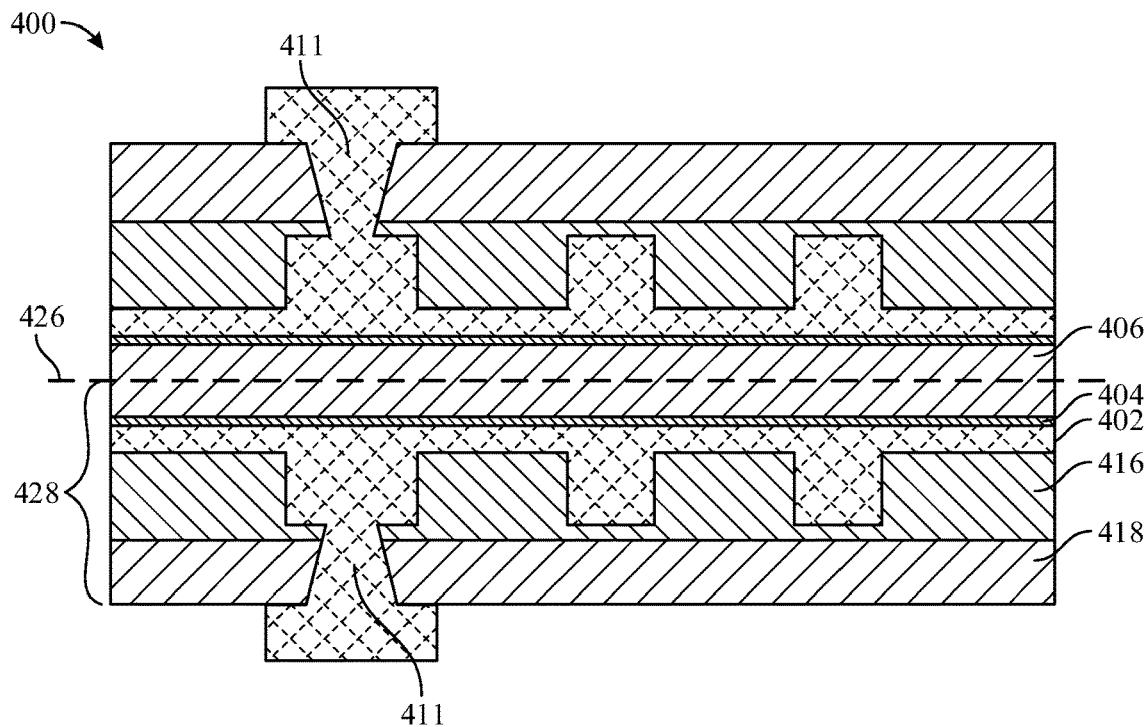

As shown in FIG. 4F, fabricating the embedded trace substrate 400 may further include depositing additional conductive plating 411, as shown, to at least partially fill the holes 422. The additional conductive plating 411 may comprise copper, aluminum, or any other suitable material. Furthermore, after the deposit, the additional conductive plating 411 may extend beyond the second dielectric layer 418, as shown.

Figure 4G:
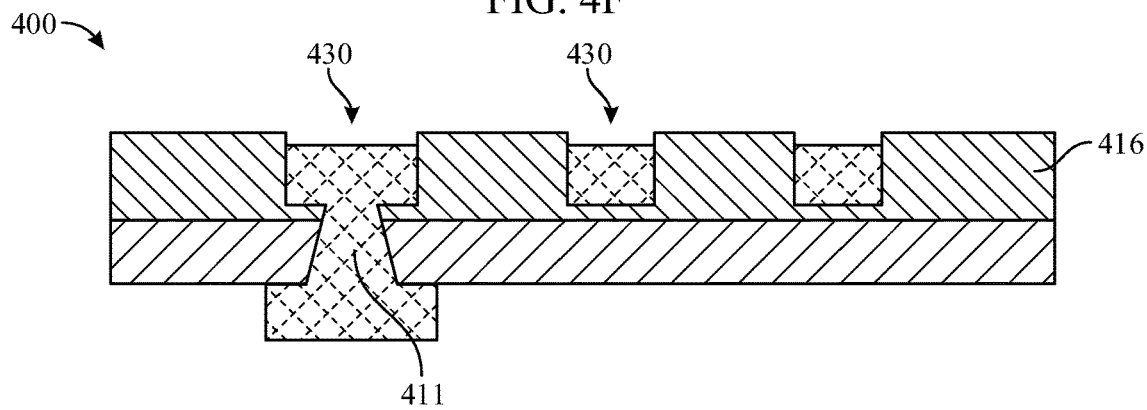
Figure 4H:
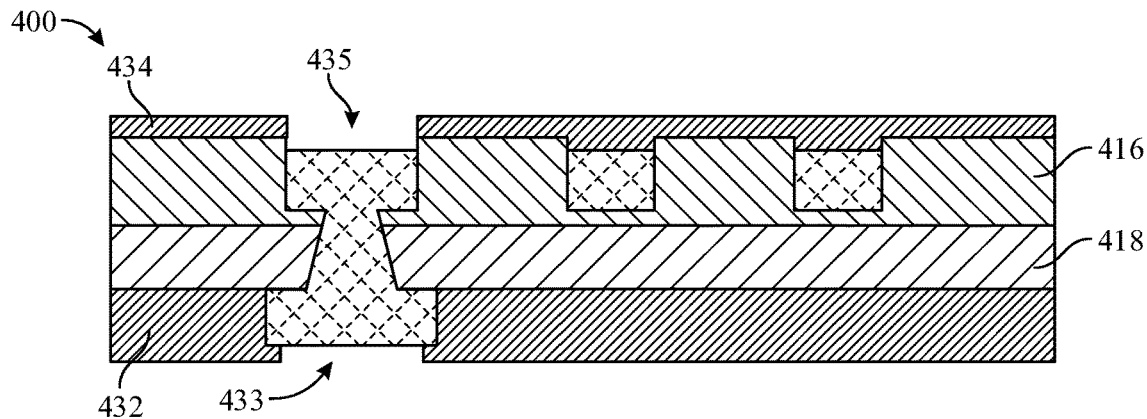

The fabrication process may also include separating the upper and lower portions of the workpiece along the line 426, which may be accomplished by cutting (e.g., blade cutting) through the sacrificial core 406. The result of such separation is depicted in FIG. 4G, which illustrates a portion of the bottom half of the workpiece depicted in FIG. 4F (or could also represent the top half of the workpiece after inverting this separated top half). As shown in FIG. 4G, the remaining portion of the sacrificial core 406 may be removed (e.g., by etching) completely, as well as the adhesive layer 404, the conductive layer 402, and a portion of the conductive plating 410. Such etching may result in the formation of one or more depressions 430 above the vias and traces in the M1 layer between portions of the first dielectric layer 416.

As shown in FIG. 4I1, fabricating the embedded trace substrate 400 may further include applying solder resist to form an upper SR layer 434 and a lower SR layer 432. The upper SR layer 434 may be disposed above the first dielectric layer 416, while the lower SR layer 432 may be disposed below the second dielectric layer 418, as shown. Gaps 435, 433 may be left in the upper SR layer 434 and/or the lower SR layer 432 corresponding to one or more vias for external connection. Fabrication of the embedded trace substrate 400 may now be considered complete. In this manner, two embedded trace substrates may be produced from a single workpiece with a detach core.

Figure 5:
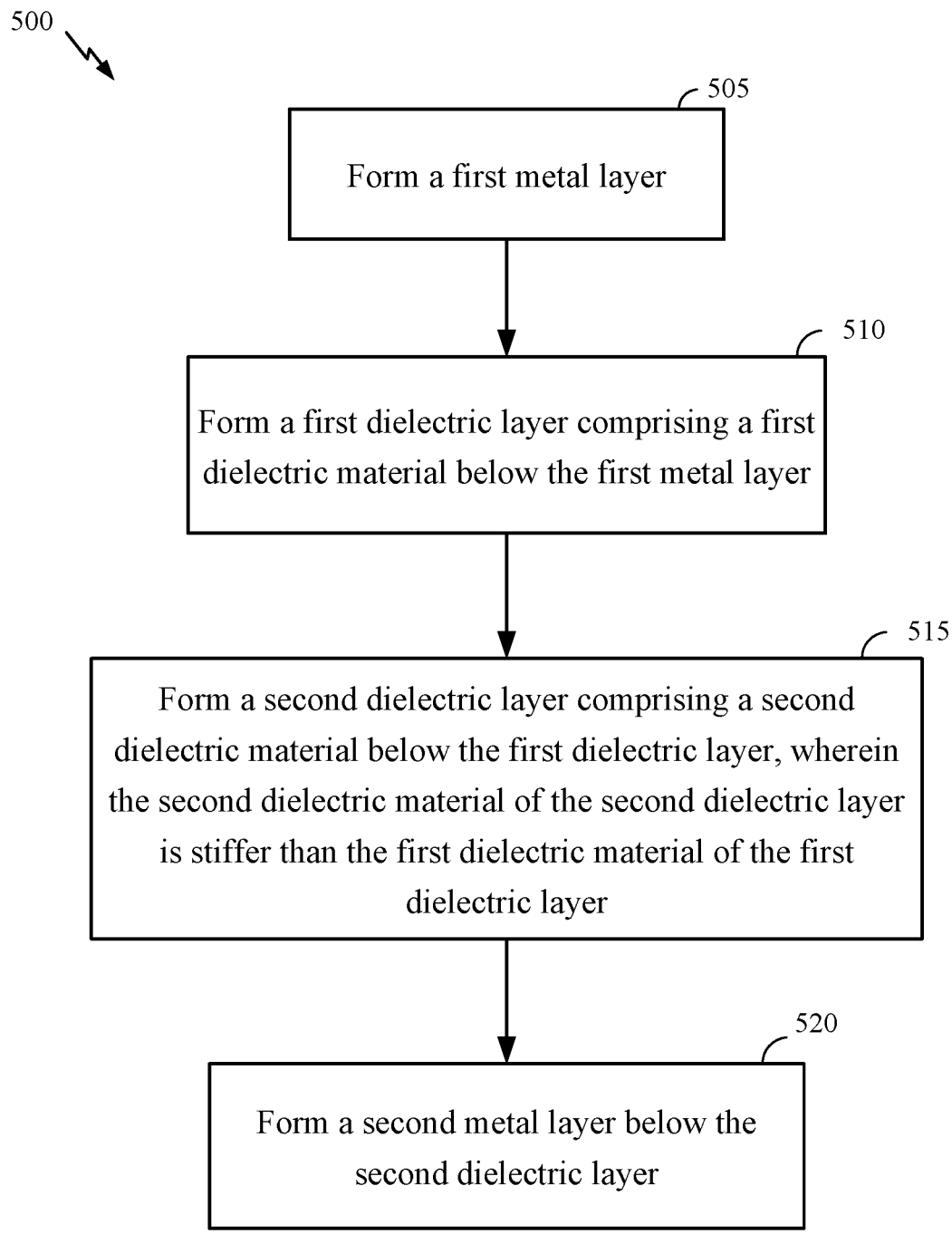
FIG. 5 is a flow diagram of exemplary operations for fabricating an embedded trace substrate, according to certain aspects of the present disclosure.

FIG. 5 is a block diagram of example operations 500 for fabricating an embedded trace substrate (e.g. the embedded trace substrate 200 (or 300) depicted in FIG. 2 (or FIG. 3), in accordance with certain aspects of the present disclosure. The operations may be performed by a semiconductor fabrication facility, for example.

The operations 500 to build an embedded trace substrate may begin at block 505 by forming a first metal layer (e.g., the M1 layer).

Referring to block 510, the operations 500 may involve forming a first dielectric layer (e.g., first dielectric layer 201) comprising a first dielectric material (e.g., prepreg material, RCC, ABF, or SR) below the first metal layer.

Referring to block 515, the operations 500 may entail forming a second dielectric layer (e.g., second dielectric layer 202) comprising a second dielectric material (e.g., a glass-woven material or a fiberglass material) below the first dielectric layer. The second dielectric material of the second dielectric layer is stiffer than the first dielectric material of the first dielectric layer.

Referring to block 520, the operations 500 may include forming a second metal layer (e.g., the M2 layer) below the second dielectric layer.

In certain aspects, the first dielectric layer has a first thickness, and the second dielectric layer has a second thickness, the second thickness being greater than the first thickness. Furthermore, the first thickness of the first dielectric layer may be between 5 μm and 25 μm inclusive. The second thickness of the second dielectric layer may be between 30 μm and 60 μm inclusive.

In certain aspects, the operations 500 may further include forming at least one via (e.g., via 108) in the embedded trace substrate, the at least one via extending across the first and second dielectric layers to the first metal layer. Furthermore, a size of the at least one via may be less than or equal to 70 μm. The forming of the at least one via may include drilling at least one hole (e.g., hole 422) in the first and second dielectric layers to the first metal layer. The forming of the at least one via may also include depositing a metallic material (e.g., conductive plating 410) in the at least one drilled hole to form the at least one via.

In certain aspects, the first dielectric material of the first dielectric layer comprises RCC, ABF, prepreg material, or SR. Furthermore, in certain aspects, the second dielectric material of the second dielectric layer is a glass-woven material.

Accordingly, instead of using a thicker prepreg for the dielectric layer in a two-layer embedded tracer substrate, certain aspects of the present disclosure provide an embedded trace substrate with a first dielectric that is more rigid than prepreg and with a second dielectric comprising a different material than the first dielectric. This enables smaller via sizes and an overall thinner embedded trace substrate.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage, or mode of operation. The term "coupled" is used herein to refer to the direct or indirect coupling between two objects. For example, if object A physically touches object B and object B touches object C, then objects A and C may still be considered coupled to one another—even if objects A and C do not directly physically touch each other. For instance, a first object may be coupled to a second object even though the first object is never directly physically in contact with the second object. The terms "circuit" and "circuitry" are used broadly and intended to include both hardware implementations of electrical devices and conductors that, when connected and configured, enable the performance of the functions described in the present disclosure, without limitation as to the type of electronic circuits.

The apparatus and methods described in the detailed description are illustrated in the accompanying drawings by various blocks, modules, components, circuits, steps, processes, algorithms, etc. (collectively referred to as "elements"). These elements may be implemented using hardware, for example.

One or more of the components, steps, features, and/or functions illustrated herein may be rearranged and/or combined into a single component, step, feature, or function or embodied in several components, steps, or functions. Additional elements, components, steps, and/or functions may also be added without departing from features disclosed herein. The apparatus, devices, and/or components illustrated herein may be configured to perform one or more of the methods, features, or steps described herein.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover at least: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c). All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

It is to be understood that the claims are not limited to the precise configuration and components illustrated above. Various modifications, changes and variations may be made in the arrangement, operation and details of the methods and apparatus described above without departing from the scope of the claims.

The invention claimed is:

1. An embedded trace substrate comprising:
   a first metal layer;
   a first dielectric layer disposed below the first metal layer and comprising a first dielectric material, wherein the first metal layer is at least partially embedded in the first dielectric layer;
   a second dielectric layer disposed below the first dielectric layer and comprising a second dielectric material, wherein the second dielectric material of the second dielectric layer is stiffer than the first dielectric material of the first dielectric layer;
   a second metal layer disposed below the second dielectric layer; and
   at least one via extending between the first and second metal layers of the embedded trace substrate and across the first and second dielectric layers, wherein:
      a combined thickness of the first dielectric layer and the second dielectric layer between the first and second metal layers is no greater than 70 µm;
      a size of the at least one via is less than or equal to 70 µm;
      at least one of the first metal layer or the second metal layer comprises a plurality of traces; and
      a line width/space (L/S) ratio supported by the embedded trace substrate, based on a minimum line width of the traces and a minimum space between adjacent traces, is 6 µm/8 µm.

2. The embedded trace substrate of claim 1, wherein the first dielectric layer has a first thickness and wherein the second dielectric layer has a second thickness, the second thickness being greater than the first thickness.

3. The embedded trace substrate of claim 2, wherein the first thickness of the first dielectric layer is between 5 µm and 25 µm.

4. The embedded trace substrate of claim 2, wherein the second thickness of the second dielectric layer is between 30 µm and 60 µm.

5. The embedded trace substrate of claim 2, wherein the first thickness of the first dielectric layer is between 5 µm and 25 µm and wherein the second thickness of the second dielectric layer is between 30 µm and 60 µm.

6. The embedded trace substrate of claim 1, wherein the combined thickness of the first dielectric layer and the second dielectric layer between the first and second metal layers is no greater than 55 µm.

7. The embedded trace substrate of claim 1, wherein the second dielectric material of the second dielectric layer is a glass-woven material.

8. The embedded trace substrate of claim 1, wherein the second dielectric material of the second dielectric layer is a fiberglass material.

9. The embedded trace substrate of claim 1, further comprising:
   a first solder resist layer disposed above the first metal layer; and
   a second solder resist layer disposed below the second metal layer.

10. The embedded trace substrate of claim 1, wherein the first dielectric material of the first dielectric layer comprises Ajinomoto build-up film (ABF) or pre-impregnated (prepreg) material.

11. An embedded trace substrate comprising:
    a first metal layer;
    a first dielectric layer disposed below the first metal layer and comprising a first dielectric material, wherein the first dielectric material of the first dielectric layer comprises solder resist and wherein the first metal layer is at least partially embedded in the first dielectric layer;

a second dielectric layer disposed below the first dielectric layer and comprising a second dielectric material, wherein the second dielectric material of the second dielectric layer is stiffer than the first dielectric material of the first dielectric layer;

a second metal layer disposed below the second dielectric layer; and at least one via extending between the first and second metal layers of the embedded trace substrate and across the first and second dielectric layers, wherein:

a combined thickness of the first dielectric layer and the second dielectric layer between the first and second metal layers is no greater than 70 μm;

a size of the at least one via is less than or equal to 70 μm;

at least one of the first metal layer or the second metal layer comprises a plurality of traces;

the embedded trace substrate has a line width/space (L/S) ratio of 6 μm/8 μm; and the L/S ratio is based on a minimum line width of the traces and a minimum space between adjacent traces in the plurality of traces.

12. The embedded trace substrate of claim 11, wherein the first dielectric layer has a first thickness and wherein the second dielectric layer has a second thickness, the second thickness being greater than the first thickness.

13. The embedded trace substrate of claim 12, wherein the first thickness of the first dielectric layer is between 5 μm and 25 μm and wherein the second thickness of the second dielectric layer is between 30 μm and 60 μm.

14. The embedded trace substrate of claim 12, wherein the first thickness of the first dielectric layer is between 5 μm and 25 μm.

15. The embedded trace substrate of claim 12, wherein the second thickness of the second dielectric layer is between 30 μm and 60 μm.

16. The embedded trace substrate of claim 11, wherein the second dielectric material of the second dielectric layer is a glass-woven material.

17. The embedded trace substrate of claim 11, wherein the second dielectric material of the second dielectric layer is a fiberglass material.

* * * * *